(12) United States Patent
Takahashi

(10) Patent No.: US 10,669,372 B2
(45) Date of Patent: Jun. 2, 2020

(54) PIEZOELECTRIC ACTUATOR

(71) Applicant: BROTHER KOGYO KABUSHIKI KAISHA, Nagoya-shi, Aichi-ken (JP)

(72) Inventor: Yoshikazu Takahashi, Nagoya (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 0 days.

(21) Appl. No.: 16/433,508

(22) Filed: Jun. 6, 2019

(65) Prior Publication Data

US 2020/0055981 A1 Feb. 20, 2020

Related U.S. Application Data

(63) Continuation of application No. 15/375,917, filed on Dec. 12, 2016, now Pat. No. 10,316,138, which is a
(Continued)

(30) Foreign Application Priority Data

Aug. 31, 2009 (JP) .................................. 2009-200744

(51) Int. Cl.
*C08G 63/08* (2006.01)
*H01L 41/047* (2006.01)
(Continued)

(52) U.S. Cl.
CPC .......... *C08G 63/08* (2013.01); *B41J 2/14233* (2013.01); *H01L 41/047* (2013.01);
(Continued)

(58) Field of Classification Search
None
See application file for complete search history.

(56) References Cited

U.S. PATENT DOCUMENTS 6,270,203 B1    8/2001  Kitahara et al.
7,284,841 B2   10/2007  Imai et al.
(Continued)

FOREIGN PATENT DOCUMENTS

JP   2002-137386 A   5/2002
JP   2003-118110 A   4/2003
(Continued)

OTHER PUBLICATIONS

Office Action dated May 15, 2012 from related U.S. Appl. No. 12/872,410.
Notice of Allowance dated May 13, 2014 from related U.S. Appl. No. 12/872,410.
Notice of Reasons for Rejection dated May 19, 2015 received in related application JP 2014-125039 together with an English language translation.
(Continued)

*Primary Examiner* — Jerry Rahll

(57) ABSTRACT

A piezoelectric actuator is provided, including a vibration plate, a piezoelectric layer, a plurality of individual electrodes arranged in two arrays, first and second common electrodes which have first and second facing portions facing parts of the individual electrodes and first and second connecting portions connecting the first and second facing portions respectively, and first and second wiring portions which are arranged on the vibration plate and which are connected to the first and second common electrodes respectively via first and second connecting wirings, wherein one of the first connecting wirings connects the first connecting portion and one of the first wiring portion while striding over the second connecting portion.

18 Claims, 12 Drawing Sheets

Related U.S. Application Data continuation of application No. 14/997,036, filed on Jan. 15, 2016, now Pat. No. 9,527,284, which is a continuation of application No. 14/458,870, filed on Aug. 13, 2014, now Pat. No. 9,238,368, which is a continuation of application No. 12/872,410, filed on Aug. 31, 2010, now Pat. No. 8,833,910.

(51) Int. Cl.
  *B41J 2/14* (2006.01)
  *H01L 41/09* (2006.01)

(52) U.S. Cl.
  CPC ...... *H01L 41/0475* (2013.01); *H01L 41/0973* (2013.01); *B41J 2002/14225* (2013.01); *B41J 2002/14266* (2013.01); *B41J 2002/14491* (2013.01)

(56) References Cited

U.S. PATENT DOCUMENTS

| | | | |
|---|---|---|---|
| 7,479,729 | B2 | 1/2009 | Sugahara et al. |
| 8,132,897 | B2 | 3/2012 | Kojima et al. |
| 8,333,460 | B2 | 12/2012 | Morita |
| 2002/0051038 | A1 | 5/2002 | Ito |
| 2003/0142173 | A1 | 7/2003 | Takahashi |
| 2003/0218657 | A1 | 11/2003 | Miyata |
| 2005/0258719 | A1 | 11/2005 | Sugahara et al. |
| 2006/0066684 | A1 | 3/2006 | Sugahara |
| 2007/0064052 | A1 | 3/2007 | Sugahara |
| 2007/0216258 | A1 | 9/2007 | Sugahara et al. |
| 2009/0096844 | A1 | 4/2009 | Kojima et al. |

FOREIGN PATENT DOCUMENTS

| | | |
|---|---|---|
| JP | 2004-001366 A | 1/2004 |
| JP | 2004-154987 | 6/2004 |
| JP | 2006-6096 | 1/2006 |
| JP | 2007-288153 A | 11/2007 |
| JP | 2008-54401 A | 3/2008 |
| JP | 2009-96173 | 5/2009 |

OTHER PUBLICATIONS

Office Action dated Jan. 12, 2015 from related U.S. Appl. No. 14/458,870.
Notice of Allowance dated Sep. 11, 2015 from related U.S. Appl. No. 14/458,870.
Notice of Allowance dated Aug. 10, 2016 from related U.S. Appl. No. 14/997,036.
Notice of Decision of Refusal dated Oct. 10, 2017 received in related application JP 2016-045371 together with an English language translation.
Notification of Reasons for Rejection dated Mar. 14, 2017 received in related application JP 2016-045371 together with an English language translation.
Notice of Allowance dated Jan. 30, 2019 from related U.S. Appl. No. 15/375,917.

SCANNING DIRECTION

PAPER FEEDING DIRECTION

PIEZOELECTRIC ACTUATOR

CROSS REFERENCE TO RELATED APPLICATION

The present application is a continuation application of U.S. patent application Ser. No. 15/375,917 filed on Dec. 12, 2016, which is a continuation application of U.S. patent application Ser. No. 14/997,036 filed on Jan. 15, 2016, now U.S. Pat. No. 9,527,284, which is a continuation application of U.S. patent application Ser. No. 14/458,870 filed on Aug. 13, 2014, now U.S. Pat. No. 9,238,368, which is a continuation application of U.S. patent application Ser. No. 12/872,410 filed on Aug. 31, 2010, now U.S. Pat. No. 8,833,910, which claims priority from Japanese Patent Application No. 2009-200744, filed on Aug. 31, 2009, the disclosures of which is incorporated herein by reference in its entirety.

BACKGROUND OF THE INVENTION

Field of the Invention

The present invention relates to a piezoelectric actuator, in which a piezoelectric layer is interposed between individual electrodes and common electrodes, and a liquid discharge apparatus provided with the same.

Description of the Related Art

A piezoelectric actuator has been hitherto known, including a channel unit, a top plate (vibration plate) which is arranged on an upper end of the channel unit, and a piezoelectric layer which is stacked on the vibration plate, wherein individual electrodes facing pressure chambers are arranged on one surface of the piezoelectric layer, and a first constant electric potential electrode which faces substantially central portions of the individual electrodes and a second constant electric potential electrode which faces both end portions in the transverse direction of the individual electrodes are arranged on the other surface of the piezoelectric layer. In the piezoelectric actuator constructed as described above, the portion, of the piezoelectric layer, facing the individual electrode and the first constant electric potential electrode and another portion, of the piezoelectric layer, facing the individual electrode and the second constant electric potential electrode are simultaneously deformed. Accordingly, the portions, of the piezoelectric layer and the vibration plate, which face the pressure chambers are deformed. Accordingly, it is possible to avoid the so-called crosstalk which would be otherwise caused such that the deformation of any portion of the piezoelectric layer facing a certain pressure chamber is transmitted to another portion facing another pressure chamber.

Another piezoelectric actuator has been known, including a vibration plate, a piezoelectric layer which is stacked on an upper surface of the vibration plate, pressure chambers which are aligned in two arrays in one direction on a surface, of the piezoelectric layer, facing the vibration plate, individual electrodes which are arranged at portions of the vibration plate facing the pressure chambers, a common electrode which is arranged to extend continuously while ranging over the plurality of pressure chambers on the other surface, of the piezoelectric layer, not facing the vibration plate, a driver IC which is arranged on the upper surface of the vibration plate, and wiring lines which are led out to the upper surface of the vibration plate and which connect the driver IC and the electrodes to one another. In the piezoelectric actuator constructed as described above, the wiring lines, which are connected to the individual electrodes, are laid out on the same surface, of the vibration plate, as the surface on which the individual electrodes are arranged, and the wiring lines are connected to the driver IC. Therefore, the reliability is enhanced for the connection between the individual electrodes and the driver IC. In other words, the various electrodes such as the individual electrodes and the like are connected to the driver IC without using any wiring member such as FPC or the like. Therefore, the reliability is enhanced for the electrical connection and the physical connection between the electrodes and the driver IC.

SUMMARY OF THE INVENTION

The present inventors have contrived a piezoelectric actuator which has two types of common electrodes, wherein wiring lines, which are connected to various electrodes, are led out to an upper surface of a vibration plate, and the wiring lines are connected to a driver IC. In the case of the piezoelectric actuator constructed as described above, it is also possible to avoid the crosstalk. Further, the electrodes such as individual electrodes and the like can be connected to the driver IC without using any wiring member such as FPC or the like. Therefore, the reliability is enhance for the physical and electrical connection between the driver IC and the electrodes such as the individual electrodes and the like.

Further, the present inventors have found out such a possibility that the electric potential distribution of a common electrode may be nonuniform on account of the following reason in relation to a piezoelectric actuator contrived by the present inventors. Thus, the present invention has been achieved.

According to the knowledge of the present inventors, it is preferable that the electric potential of the common electrode is uniform at all portions in order to uniformize the driving characteristics of the portions corresponding to respective pressure chambers in the piezoelectric actuator. If the wiring line for applying the electric potential is connected to the common electrode at only one position, it is feared that the electric potential (first electric potential) of the portion (first portion) of the common electrode connected to the wiring line is not identical with the electric potential (second electric potential) of the portion (second portion) separated from the terminal portion. According to the knowledge of the present inventors, it is feared that the second electric potential may be deviated from the first electric potential as the distance of electrical connection is more prolonged between the first portion and the second portion. In view of the above, the present inventors have found out the fact that it is necessary to connect the wiring lines at a plurality of mutually separated positions on the common electrode in order to suppress the nonuniform electric potential.

The two types of common electrodes described above are provided corresponding to the pressure chambers (individual electrodes) which are arranged in two arrays in one direction. Therefore, at least one of the two types of common electrodes has two portions which correspond to the individual electrodes included in the respective arrays and which are arranged while being separated from each other with the other common electrode intervening therebetween in relation to the direction perpendicular to the one direction. Therefore, in order to uniformize the electric potential between the mutually separated two portions, it is necessary that the portions should be in conduction with each other.

In this case, assume that the common electrode has the portions which are separated from each other as described above and the common electrode has no portion which allows the portions to be in conduction. Then it is possible to connect the wiring lines to the mutually separated portions respectively for the two types of common electrodes on the surface of the piezoelectric layer on which the common electrode is arranged. However, the present inventors have found out the following fact. That is, in this case, it is feared that any dispersion (fluctuation) may arise in the electric potential between the mutually separated portions.

An object of the present invention is to provide a piezoelectric actuator which is constructed such that two types of common electrodes retained at mutually different electric potentials are arranged on an identical surface of a piezoelectric layer and which makes it possible to uniformize the electric potentials of the two types of common electrodes at all portions respectively, and a liquid discharge apparatus provided with the same.

According to an aspect of the present invention, there is provided a piezoelectric actuator including:

a vibration plate;

a piezoelectric layer which is stacked on the vibration plate;

a plurality of individual electrodes which are arranged on one surface of the piezoelectric layer and which form individual electrode arrays arranged in two arrays in one direction;

a first common electrode which is arranged on the other surface of the piezoelectric layer and which has a plurality of first facing portions each facing a part of one of the individual electrodes and a first connecting portion connecting the first facing portions;

a second common electrode which is arranged on the other surface of the piezoelectric layer, which is electrically insulated from the first common electrode, and which has a plurality of second facing portions each facing another part of one of the individual electrodes and a second connecting portion connecting the second facing portions;

a plurality of first connecting wirings which are connected to the first common electrode, in the first connecting portion at a plurality of mutually separated positions;

a plurality of first wiring sections which are arranged on the vibration plate and which are connected to the first common electrode via the first connecting wirings;

a plurality of second connecting wirings which are connected to the second common electrode, in the second connecting portion at a plurality of mutually separated positions; and a plurality of second wiring sections which are arranged on the vibration plate and which are connected to the second common electrode via the second connecting wirings, wherein one of the first connecting wirings connects the first connecting portion and one of the first wiring sections while striding over the second common electrode.

Accordingly, the first connecting wiring, which connects the first connecting portion and the first wiring portion to one another while striding over (stepping over or crossing over) the second connecting portion of the second common electrode, is provided, and thus the first and second connecting wirings can be connected to the plurality of mutually separated positions of the first and second common electrodes arranged on the same surface of the piezoelectric layer. It is possible to uniformize the electric potentials of the first and second common electrodes, respectively. The description is made, for example, in the following embodiments for the purpose of convenience assuming that the common electrode, which has the facing portions facing the substantially central portions of the individual electrodes, is regarded as the first common electrode, and the common electrode, which has the facing portions facing the portions except for the substantially central portions of the individual electrodes, is regarded as the second common electrode. However, no problem arises even if it is assumed that the common electrode, which has the facing portions facing the substantially central portions of the individual electrodes, is regarded as the second common electrode, and the common electrode, which has the facing portions facing the portions except for the substantially central portions of the individual electrodes, is regarded as the first common electrode.

According to the present invention, it is possible to uniformize the electric potentials of the first common electrode and the second common electrode arranged on the same surface of the piezoelectric layer respectively.

DESCRIPTION OF THE PREFERRED EMBODIMENTS

First Embodiment

A preferred first embodiment of the present teaching will be explained below.

Figure 1:
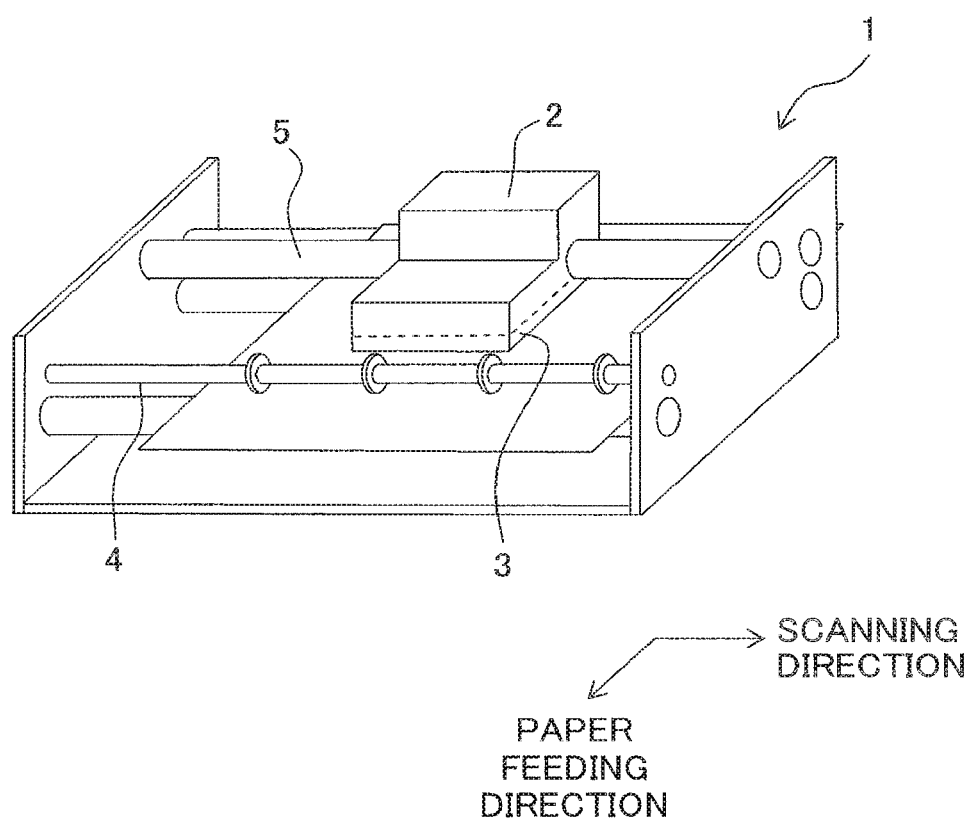
FIG. 1 shows a schematic arrangement of a printer according to a first embodiment.

As shown in FIG. 1, a printer 1 includes, for example, a carriage 2, an ink-jet head 3, and a transport roller 4. The carriage 2 is reciprocatively movable along a guide shaft 5 which extends in the scanning direction (left-right direction in FIG. 1). The ink-jet head 3 is arranged on a lower surface of the carriage 2, and the ink-jet head 3 discharges inks from nozzles 15 (see FIG. 2) arranged on the lower surface thereof. The transport roller 4 (transport mechanism) transports the recording paper P in the paper feeding direction (frontward direction in FIG. 1) in cooperation with an unillustrated motor.

In the printer 1, the inks are discharged to the recording paper P, which is transported in the paper feeding direction by the transport roller 4, by the ink-jet head 3 which is reciprocatively moved in the scanning direction together with the carriage 2, and thus the printing is performed on the recording paper P. The recording paper P, for which the printing has been completed, is transported in the paper feeding direction by the transport roller 4, and thus the recording paper P is discharged from the printer 1.

Next, the ink-jet head 3 will be explained. In order to recognize the positional relationship more comprehensively, a piezoelectric layer 42 described later on is depicted by two-dot chain lines in FIG. 3, and a through-hole 46a of an insulating layer 46 described later on and a portion of a wiring line 47e arranged on the upper surface of the insulating layer 46 are depicted by two-dot chain lines respectively in FIG. 4.

The ink-jet head 3 includes a channel unit 31 which is formed with ink channels including, for example, pressure chambers 10 and the nozzles 15, and a piezoelectric actuator 32 which is arranged on the upper surface of the channel unit 31 and which applies the pressure to the inks contained in the pressure chambers 10.

Figure 5:
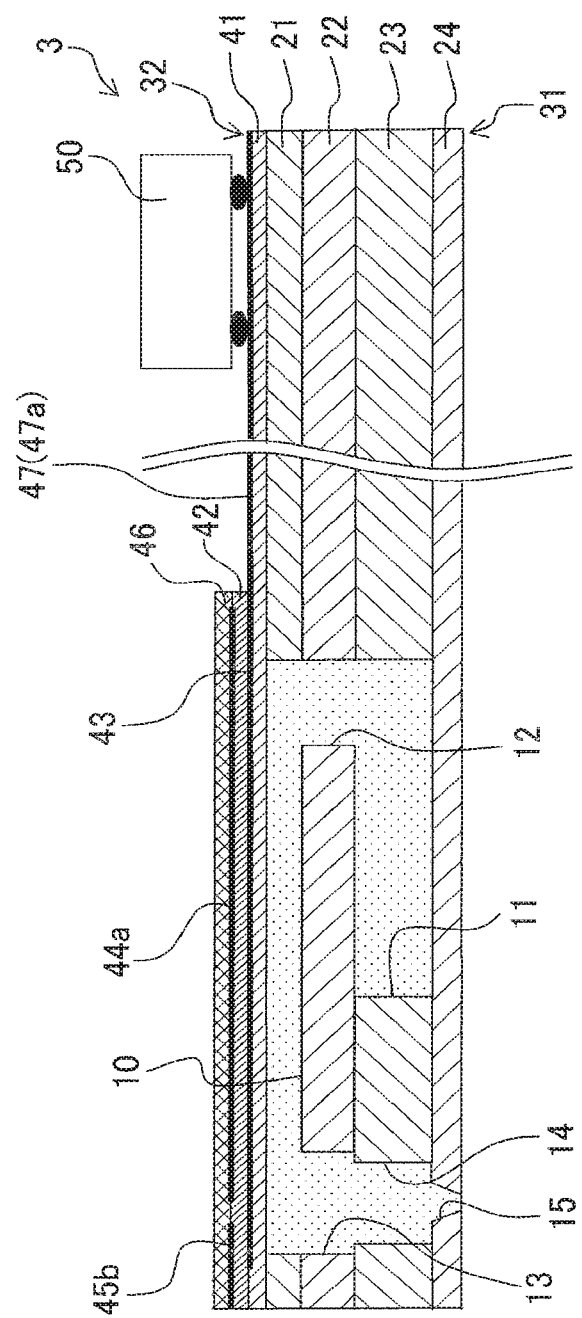
FIG. 5 shows a sectional view taken along a line V-V shown in FIG. 2.
Figure 6:
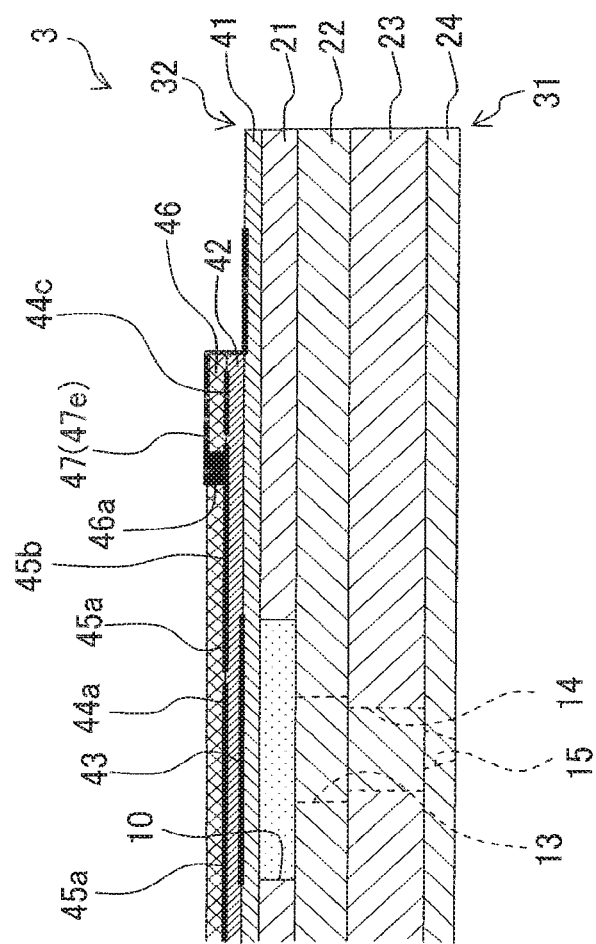
FIG. 6 shows a sectional view taken along a line VI-VI shown in FIG. 2.

As shown in FIGS. 5 and 6, the channel unit 31 is formed by mutually stacking four plates of a cavity plate 21, a base plate 22, a manifold plate 23, and a nozzle plate 24. The three plates 21 to 23 except for the nozzle plate 24, which are included in the four plates 21 to 24, are formed of a metal material such as stainless steel. The nozzle plate 24 is formed of a synthetic resin material such as polyimide. Alternatively, the nozzle plate 24 may be also formed of a metal material in the same manner as the other three plates 21 to 23.

A plurality of pressure chambers 10 and an ink supply port 9 (see FIG. 2) are arranged in the cavity plate 21. The pressure chambers 10 have substantially elliptical shapes in a plan view in which the scanning direction (left-right direction in FIG. 2) is the longitudinal direction of the elliptical pressure chamber 10, and the pressure chambers 10 are arranged in two arrays in the paper feeding direction (one direction). Substantially circular through-holes 12, 13 are arranged respectively at portions of the base plate 22 opposed to the both end portions of the plurality of pressure chambers 10 in the scanning direction. The ink supply port 9 is formed at a position communicated with a manifold channel 11 as described later on.

The manifold plate 23 is formed with the manifold channel 11 which extends in the paper feeding direction (up-down direction in FIG. 2) so that the manifold channel 11 is overlapped with substantially half portions of the pressure chambers 10 in each of the arrays disposed on the side of the through-holes 12 in the scanning direction. In this arrangement, the ink is supplied from the ink supply port 9 to the manifold channel 11. Further, the manifold plate 23 is formed with substantially circular through-holes 14 at portions overlapped with the through-holes 13. The nozzle plate 24 is formed with the nozzles 15 at portions overlapped with the through-holes 14.

In the channel unit 31, the manifold channel 11 is communicated with the pressure chambers 10 via the through-holes 12, and the pressure chambers 10 are communicated with the nozzles 15 via the through-holes 13, 14. In this way, a plurality of individual ink channels, which range from the outlets of the manifold channel 11 via the pressure chambers 10 to arrive at the nozzles 15, are formed in the channel unit 31.

The piezoelectric actuator 32 is provided with a vibration plate 41, a piezoelectric layer 42, a plurality of individual electrodes 43, common electrodes 44, 45, an insulating layer 46, and a plurality of wiring lines 47.

The vibration plate 41 is arranged on the upper surface of the cavity plate 21 so that the plurality of pressure chambers 10 are covered therewith. The vibration plate 41 is formed of, for example, a ceramics material such as alumina, zirconia, PZT described later on or the like or a metal material such as stainless steel or the like. However, when the vibration plate 41 is formed of the metal material, in order to avoid the conduction between the conductive vibration plate 41 and the individual electrodes 43 and/or the wiring lines 47 described later on, it is necessary that an insulating layer (not shown), which is formed of, for example, a ceramics material, should be arranged on the upper surface of the vibration plate 41 and that the individual electrodes 43 and the wiring lines 47 should be arranged thereon.

The piezoelectric layer 42 is formed of a piezoelectric material (PZT) containing a main component of lead titanate zirconate as the mixed crystal of lead titanate and lead zirconate. The piezoelectric layer 42 is arranged on the upper surface of the vibration plate. The piezoelectric layer 42 extends continuously while ranging over the portions facing the plurality of pressure chambers 10.

The individual electrodes 43 are arranged on the upper surface of the vibration plate 41 (lower surface (one surface) of the piezoelectric layer 42), corresponding to the pressure chambers 10. The individual electrodes 43 have substantially elliptical shapes which are slightly larger than those of the pressure chambers 10 in a plan view, and the individual electrodes 43 are arranged so that the pressure chambers 10 are entirely covered therewith. Accordingly, the individual electrodes 43 are arranged in two arrays in the paper feeding direction in the same manner as the pressure chambers 10. The individual electrodes 43 are connected to a driver IC 50 as described later on. Any one of the electric potentials of the ground electric potential and the predetermined positive electric potential (for example, about 20 V) is selectively applied by the driver IC 50.

The common electrode 44 (first common electrode) is arranged on the upper surface of the piezoelectric layer 42. Further, the common electrode 44 is connected to the driver IC 50 as described later on. The common electrode 44 is always retained at the ground electric potential by the driver IC 50. The common electrode 44 has a plurality of facing portions 44a (first opposing portions, first facing portion), two connecting portions 44b, and a joining portion 44c. In this embodiment, a combination of the two connecting portions 44b and the joining portion 44c corresponds to the first connecting portion according to the present teaching.

The facing portions 44a have substantially elliptical shapes which are one size smaller than those of the pressure chambers 10 as viewed in a plan view, and the facing portions 44a are arranged so that the facing portions 44a face substantially central portions (certain portions) of the pressure chambers 10 (individual electrodes 43). Accordingly, the facing portions 44a are arranged in two arrays in the paper feeding direction in the same manner as the individual electrodes 43. The two connecting portions 44b extend in the paper feeding direction (one direction) respectively. The two connecting portions 44b mutually connect left end portions of the facing portions 44a constituting the left array and right end portions of the facing portions 44a constituting the right array. The joining portion 44c extends in the scanning direction. The joining portion 44c mutually connects upper end portions of the two connecting portions 44b.

The common electrode 45 (second common electrode) is arranged in an area on the same upper surface of the piezoelectric layer 42 as the surface on which the common electrode 44 is arranged, the area being surrounded by the two connecting portions 44b and the joining portion 44c. The common electrode 45 is provided with a plurality of facing portions 45a (second opposing portions, second facing portions) and a connecting portion 45b (second connecting portion). The facing portions 45a are arranged to face outer portions, of the pressure chambers 10, disposed outside the facing portions of the pressure chambers 10 facing the common electrode 44. The connecting portion 45b is the portion, of the common electrode 45, as provided by excluding the facing portions 45a from the common electrode 45. The connecting portion 45b mutually connects the facing portions 45a.

The common electrode 45 is connected to the driver IC 50 as described later on. The common electrode 45 is always retained at the constant positive electric potential by the driver IC 50.

In this arrangement, the portions of the piezoelectric layer 42 described above which are interposed between the individual electrodes 43 and the common electrode 44 (facing portions 44a) and the portions interposed between the individual electrodes 43 and the common electrode 45 (facing portions 45a) are polarized in the thickness direction of the piezoelectric layer 42.

The insulating layer 46 is formed of an insulative material including, for example, a ceramics material such as alumina, zirconia, PZT or the like or a synthetic resin material. The insulating layer 46 is arranged over the substantially entire region of the upper surface of the piezoelectric layer 42 so that the common electrodes 44, 45 are covered therewith. The common electrode 44 and the common electrode 45 are arranged closely to one another on the same upper surface of the piezoelectric layer 42. Therefore, it is feared that the common electrode 44 and the common electrode 45 may be in conduction on account of the migration caused by the material for forming the electrodes. However, the insulating layer 46 is arranged to cover the common electrode 44 and the common electrode 45. Therefore, the occurrence of the migration as described above is avoided. Further, when a thin-layered insulating layer 46 is used, it is possible to thin the piezoelectric actuator 32. A substantially circular through-hole 46a, which is filled with a conductive material, is formed through the insulating layer 46 at a portion opposed to a right-upward end portion of the common electrode 45 as viewed in FIG. 2.

Figure 2:
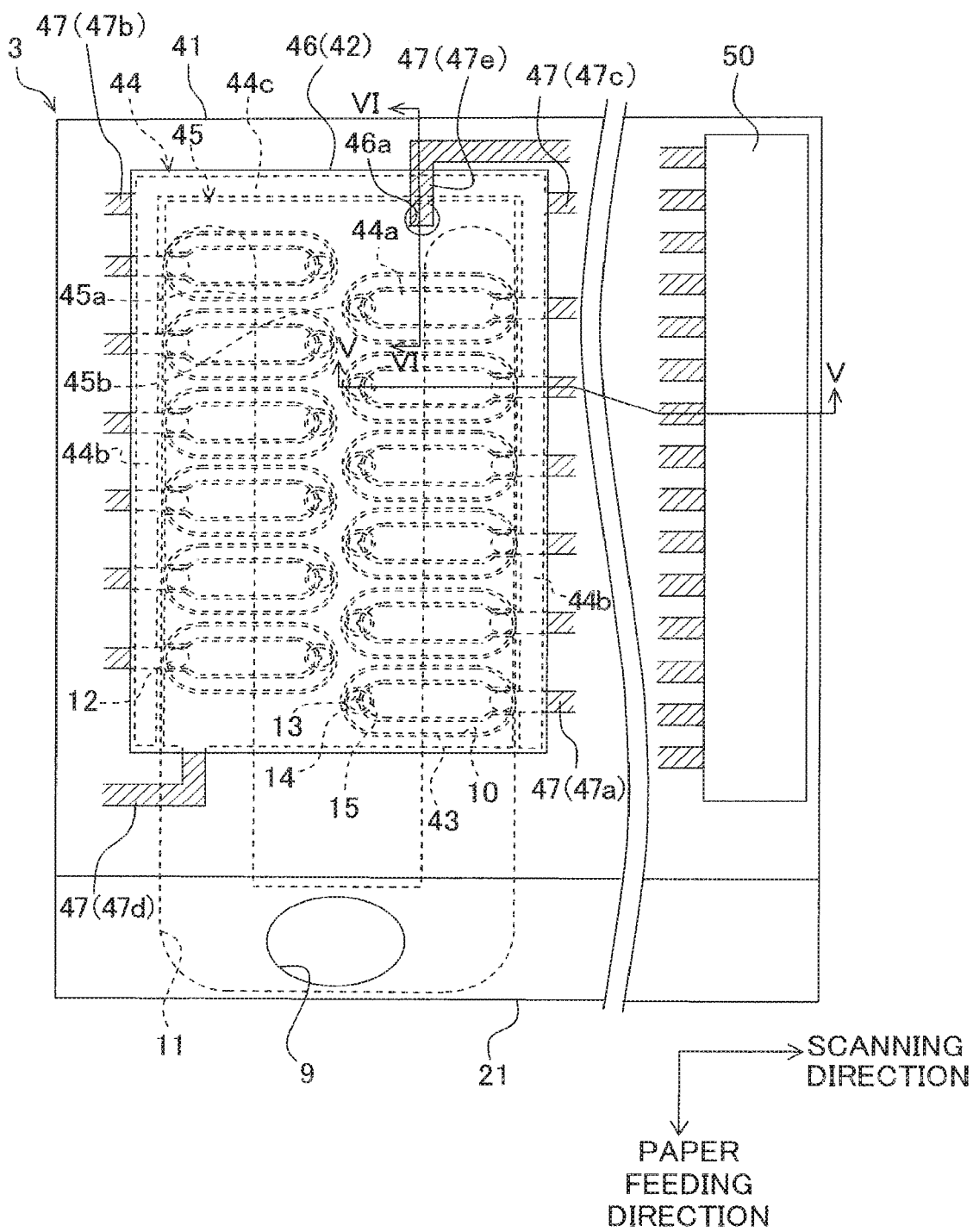
FIG. 2 shows a plan view illustrating an ink-jet head shown in FIG. 1.
Figure 3:
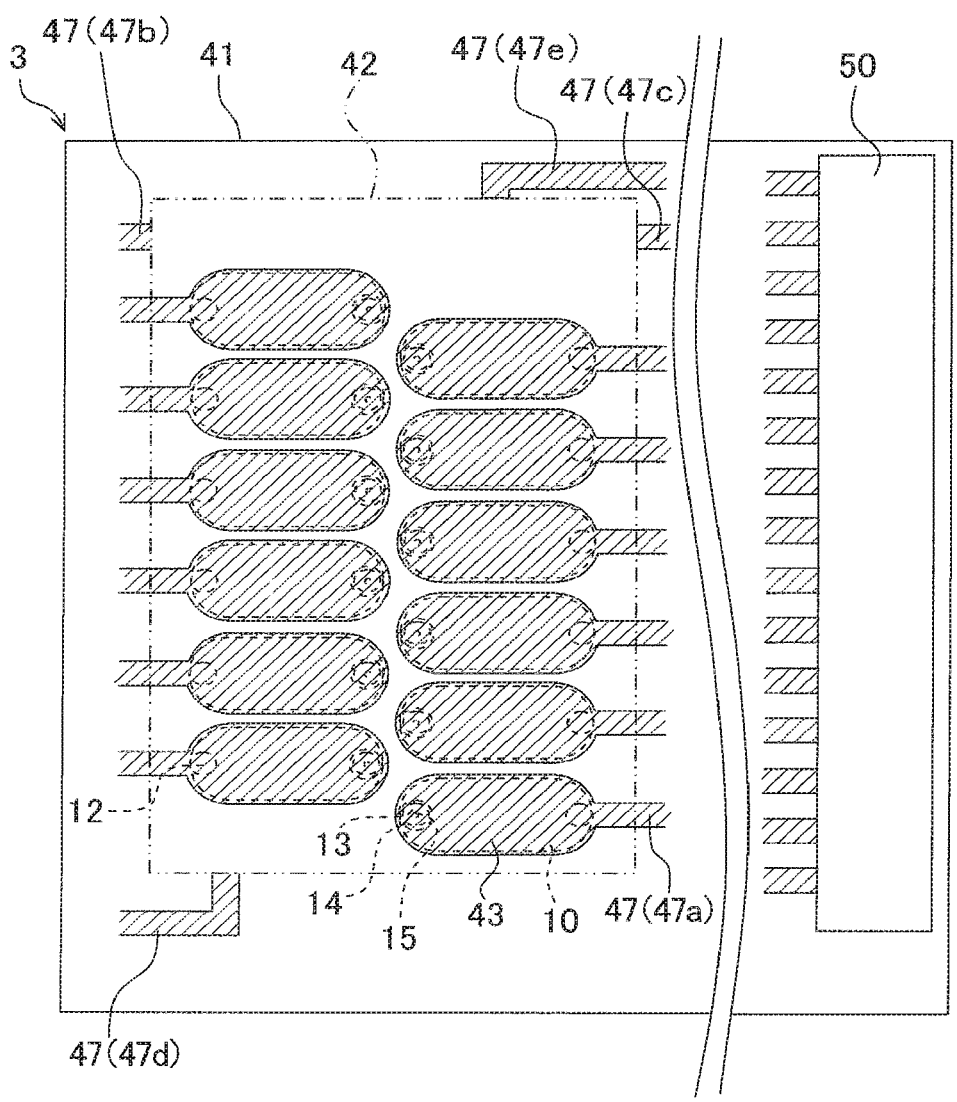
FIG. 3 shows a plan view illustrating an upper surface of a vibration plate shown in FIG. 2.
Figure 4:
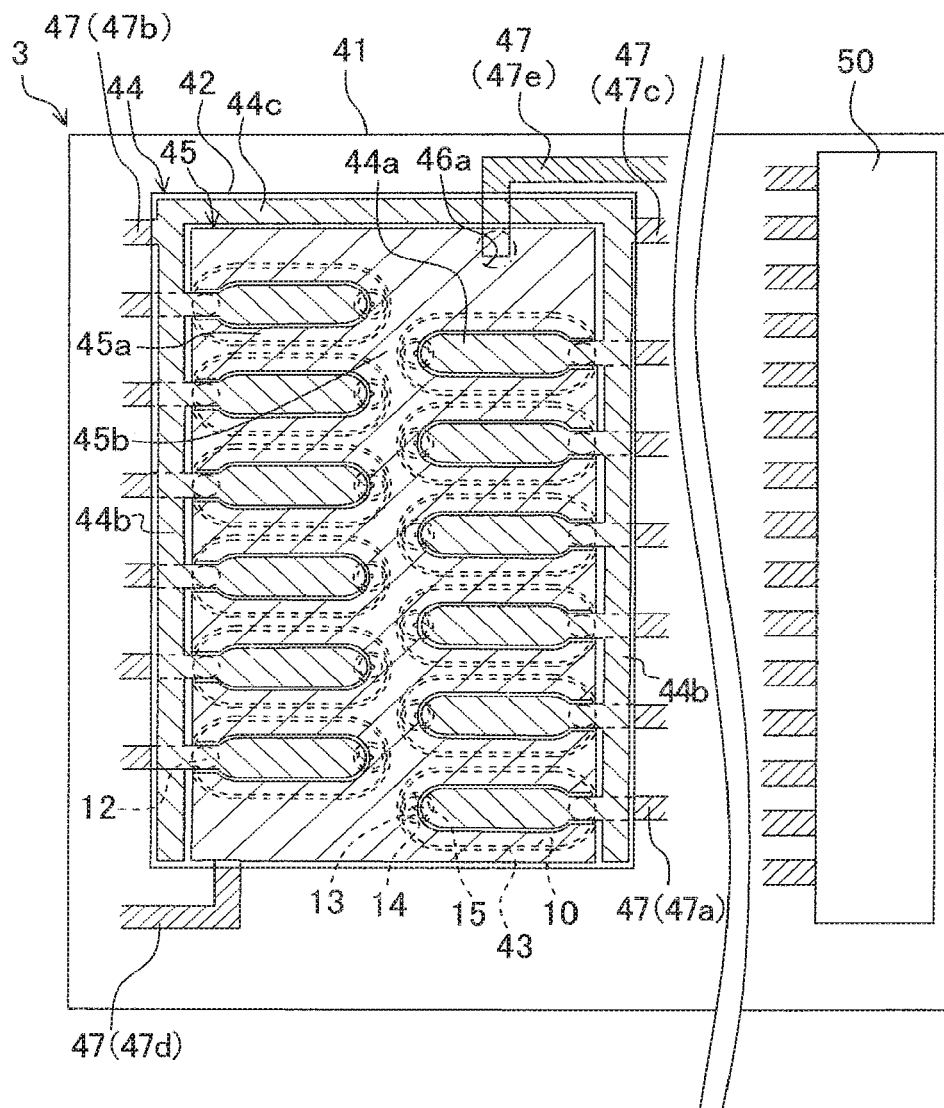
FIG. 4 shows a plan view illustrating an upper surface of a piezoelectric layer shown in FIG. 2.

The plurality of wiring lines 47 include a plurality of wiring lines 47a which are individually connected to the individual electrodes 43, two wiring lines 47b, 47c which are connected to the common electrode 44, and two wiring lines 47d, 47e which are connected to the common electrode 45. First ends of the wiring lines 47 are connected to the respective electrodes 43, 44, 45, and second ends of the wiring lines 47 are connected to the driver IC 50 arranged on the vibration plate 41. FIGS. 2 to 4 show portions, of the wiring lines 47, disposed in the vicinity of the connecting portions with respect to the electrodes 43 to 45 and other portions disposed in the vicinity of the connecting portions with respect to the driver IC 50. The other portions of the wiring lines 47 are omitted from the illustration.

The wiring lines 47a to 47e will be explained in further detail below. The first end of the wiring line 47a is connected to the end portion of the individual electrode 43 disposed on the side opposite to the nozzle 15 in the scanning direction. Further, the wiring line 47a is laid out from the concerning portion on the upper surface of the vibration plate 41 which is positioned on the same surface as the surface on which the individual electrode 43 is arranged. The second end of the wiring line 47a is connected to the driver IC 50.

In this arrangement, the wiring lines 47a, which are provided individually for the individual electrodes 43, have the largest number among the wiring lines 47. However, the wiring lines 47a are laid out on the same surface as the surface on which the individual electrodes 43 are arranged, and the wiring lines 47a are connected to the driver IC 50. Therefore, for example, the disconnection or breaking of the wire is hardly caused, and the reliability of the connection is enhanced.

As shown in FIG. 2, the first ends of the two wiring lines 47b, 47c are connected to the upper end portions of the left connecting portion 44b and the right connecting portion 44b, respectively, on the upper surface of the piezoelectric layer 42. Further, the wiring lines 47b, 47c are led out, from the connecting portions, to the upper surface of the vibration plate 41 via the left and right side surfaces of the piezoelectric layer 42 as viewed in FIG. 2, respectively. Further, the wiring lines 47b, 47c are laid out on the vibration plate 41, and the second ends of the wiring lines 47b, 47c are connected to the driver IC 50. In this embodiment, the portions of the two wiring lines 47b, 47c, which are arranged on the upper surface of the vibration plate 41, correspond to the first wiring portions according to the present teaching, and the portions, which connect the first wiring line portions and the connecting portions 44b, correspond to the first connecting wirings according to the present teaching.

The first end of the wiring line 47d is connected to the lower-left end portion (connecting portion 45b) of the common electrode 45 as viewed in FIG. 2 on the upper surface of the piezoelectric layer 42. The wiring line 47d is led out from the connecting portion to the upper surface of the vibration plate 41 via the lower side surface of the piezoelectric layer 42 as viewed in FIG. 2. Further, the wiring line 47d is laid out on the upper surface of the vibration plate 41, and the second end of the wiring line 47d is connected to the driver IC 50.

The first end of the wiring line 47e is positioned at the portion of the upper surface of the insulating layer 46 (surface disposed on the side opposite to the piezoelectric layer 42) facing the through-hole 46a, and the first end of the wiring line 47e is connected to the upper-right end portion (connecting portion 45b) of the common electrode 45, as viewed in FIG. 2, via the conductive material charged into the through-hole 46a. The wiring line 47e extends from the connecting portion on the upper surface of the insulating layer 46 to the upper end of the insulating layer 46 in the upward direction as viewed in FIG. 2. In this arrangement, the wiring line 47e is arranged on the upper surface of the insulating layer 46 so that the wiring line 47e strides over (steps over) the joining portion 44c of the common electrode 44.

As shown in FIG. 6, the wiring line 47e is further led out to the upper surface of the vibration plate 41 via the insulating layer 46 and the side surface of the piezoelectric layer 42. The wiring line 47e is laid out on the vibration plate 41, and the second end of the wiring line 47e is connected to the driver IC 50.

In this embodiment, the portions of the wiring lines 47d, 47e, which are arranged on the upper surface of the vibration plate 41, correspond to the second wiring portions according to the present teaching. The portions of the wiring lines 47d, 47e, which connect the second wiring portions and the common electrode 45 (connecting portion 45b), correspond to the second connecting wirings according to the present teaching. In the first embodiment, as described above, the second connecting wiring line extends while striding over the first connecting portion.

In this arrangement, unlike the wiring lines 47a connected to the individual electrodes 43, the wiring lines 47b to 47e, which are connected to the common electrodes 44, 45, are led out from the connecting portions with respect to the respective electrodes to the upper surface of the vibration plate 41 which is positioned at the height different from that of the connecting portions. That is, the first and second connecting wirings, which are connected to the first and second wiring line portions, are arranged on the surface having the height (position in relation to the stacking direction of the vibration plate 41 and the piezoelectric layer 42) different from that of the surface on which the first and second wiring portions are arranged. Therefore, it is feared that the reliability of the connection may be deteriorated or lowered as compared with the wiring lines 47a. However, as described above, the two wiring lines 47b, 47c are connected to the common electrode 44, and the two wiring lines 47d, 47e are connected to the common electrode 45. Therefore, even if any one of the two wiring lines is discontinued or broken, any fear, in which the electric potential of the electrode may be greatly fluctuated, is not caused. Any fear, in which the piezoelectric actuator 32 cannot be driven, is not caused as well.

When the numbers of the wiring lines connected to the common electrodes 44, 45 are further increased, it is also possible to improve the reliability of the connection. Even in this case, the numbers can be increased with ease as compared with the case in which the number of the wiring lines connected to the respective individual electrodes 43 having the large number is further increased.

The method for driving the piezoelectric actuator 32 will now be explained. In the piezoelectric actuator 32, the plurality of individual electrodes 43 are previously retained at the ground electric potential. As described above, the constant positive electric potential is applied to the common electrode 45. Therefore, the electric potential difference arises between the individual electrodes 43 and the common electrode 45 (facing portions 45a). The electric field, which is in the direction parallel to the polarization direction, is generated at the portion (first active portion) of the piezoelectric layer 42 interposed between the electrodes. Accordingly, the concerning portion of the piezoelectric layer 42 is shrunk in the horizontal direction perpendicular to the direction of the electric field. As a result, the portions of the vibration plate 41, the piezoelectric layer 42, and the insulating layer 46, which face the pressure chambers 10, are deformed as a whole to protrude toward the opposite side of the pressure chambers 10. The volume of the pressure chambers 10 are increased as compared with the state in which the deformation is not caused.

When the piezoelectric actuator 32 is driven, the electric potential of any desired individual electrode 43 is switched from the ground electric potential to the positive electric potential. In this situation, the individual electrode 43, which has been switched to have the positive electric potential, has the electric potential equal to that of the common electrode 45. Therefore, the portion of the piezoelectric layer 42, which is interposed between the individual electrode 43 and the common electrode 45, is returned to the state having been provided before the shrinkage. On the other hand, as described above, the electric potential difference arises between the individual electrode 43 and the common electrode 44 (facing portion 44a), because the ground electric potential is applied to the common electrode 44. Accordingly, the electric field, which is directed in the direction parallel to the polarization direction, is generated at the portion (second active portion) of the piezoelectric layer 42 interposed between the individual electrode 43 and the common electrode 44 (facing portion 44a). The concerning portion of the piezoelectric layer 42 is shrunk in the horizontal direction perpendicular to the direction of the electric field. Accordingly, the portions of the vibration plate 41, the piezoelectric layer 42, and the insulating layer 46, which are opposed to the corresponding pressure chamber 10, are deformed as a whole to protrude toward the corresponding pressure chamber 10, and the volume of the pressure chamber 10 is decreased. As a result, the pressure of the ink contained in the pressure chamber 10 is raised, and the ink is discharged from the nozzle 15 communicated with the corresponding pressure chamber 10. After the ink discharge, the electric potential of the individual electrode 43 is switched from the positive electric potential to the ground electric potential, and the piezoelectric actuator 32 is returned to the initial state.

In this situation, in the piezoelectric actuator 32, when the electric potential of the individual electrode 43 is switched from the ground electric potential to the positive electric potential, the portion of the piezoelectric layer 42, which is interposed between the individual electrode 43 and the facing portion 44a, is shrunk in the horizontal direction. Further, simultaneously therewith, the portion of the piezoelectric layer 42, which is interposed between the individual electrode 43 and the facing portion 45a, is elongated from the shrunk state to the state having been provided before the shrinkage. Accordingly, the influence exerted by the shrinkage of the piezoelectric layer 42 and the influence exerted by the elongation thereof are counteracted with each other. As a result, it is possible to avoid the so-called crosstalk which would be otherwise caused such that the deformation of any portion of the piezoelectric layer 42 facing a certain pressure chamber 10 is transmitted to any other portion facing another pressure chamber 10.

In order to uniformize, for example, the discharge speed and the volumes of the ink droplets discharged from the respective nozzles 15 when the piezoelectric actuator 32 is driven, it is necessary that the electric field, which is generated in the piezoelectric layer 42, should be uniformized. For this purpose, it is necessary that the electric potentials of the common electrodes 44, 45 should be uniformized at all portions respectively. It is hypothetically assumed that one contact is provided between each of the wiring lines 47 and each of the common electrodes 44, 45. In this case, it is difficult to uniformize the electric potentials at all portions of the common electrodes 44, 45 respectively, because the common electrodes 44, 45 are the relatively large electrodes which are provided to range over the plurality of pressure chambers 10 (individual electrodes 43). That is, the electric potentials of the common electrodes 44, 45 are not uniform in all areas. As the portions of the common electrodes 44, 45 are separated farther from the portions of connection with respect to the wiring lines 47, the electric potentials of the concerning portions are more deviated from the electric potentials provided at the contact portions with respect to the wiring lines 47. Therefore, in order to uniformize the electric potential, as described above, it is necessary that the wiring lines 47 (first and second connecting wirings) should be connected at a plurality of positions of the common electrodes 44, 45 separated from each other.

As for the common electrode 44, the two connecting portions 44b are arranged while being separated from each other in the scanning direction. Therefore, in order to uniformize the electric potential of the common electrode 44, it is necessary that the two connecting portions 44b should be connected to one another.

However, it is difficult that, on the upper surface of the piezoelectric layer 42, all of the wiring lines 47, which are connected to the plurality of mutually separated portions of the common electrodes 44, 45, are connected to the common electrodes 44, 45, and that, on the upper surface of the piezoelectric layer 42, the two connecting portions 44b are connected to one another.

This situation will be explained specifically below. When the common electrode 44 has the joining portion 44c, and the two connecting portions 44b are connected to one another by the joining portion 44c on the upper surface of the piezoelectric layer 42 as in this embodiment, then the electric potential is uniformized for the two connecting portions 44b. However, in this case, the common electrode 45 is surrounded on the three sides by the two connecting portions 44b and the joining portion 44c. Therefore, if the situation holds as it is, it is inevitable that the wiring line 47d, which is connected to the common electrode 45, should be connected to only the lower end portion of the common electrode 45. In this case, it is feared that the electric potential provided at the upper end portion of the common electrode 45 separated from the connecting portion with respect to the wiring line 47 and the electric potential provided in the area near to the connecting portion with respect to the wiring line 47d may be nonuniform.

On the other hand, if the joining portion 44c is removed from the common electrode 44, then the wiring lines 47 can be connected to the upper end portion and the lower end portion of the common electrode 45 (connecting portion 45b) on the upper surface of the piezoelectric layer 42, and hence it is possible to uniformize the electric potential of the common electrode 45. However, in this case, the two connecting portions 44b are not connected to one another. Therefore, it is feared that any dispersion may arise in the electric potential between the two connecting portions 44b.

On the contrary, in this embodiment, as described above, the two connecting portions 44b of the common electrode 44 are connected by the joining portion 44c, and the wiring line 47d is connected to the lower end portion of the connecting portion 45b of the common electrode 45. Further, the wiring line 47e (second connecting wiring), which extends on the upper surface of the insulating layer 46 while striding over the joining portion 44c, is connected to the upper end portion of the connecting portion 45b. Therefore, it is possible to uniformize the electric potentials of the common electrodes 44, 45 respectively.

Further, the wiring line 47e, which is connected to the common electrode 45 while striding over the joining portion 44c, is arranged on the upper surface of the insulating layer 46 which covers the common electrodes 44, 45 therewith. Therefore, it is possible to prevent the wiring line 47c from any conduction with the joining portion 44c. The portion of the common electrode 45 to which the wiring line 47e is connected and the portion to which the wiring line 47d is connected are formed at the positions (positions substantially in point symmetry with respect to the center of the common electrode 45) separated from each other in the diagonal line direction of the substantially rectangular common electrode 45, in order to secure the distance between these portions. In this way, in order to uniformize the electric potential distribution of the common electrode as uniformly as possible, it is desirable that the wiring lines, which supply the electric potential to the common electrode, are connected to the common electrode at the positions which are separated from each other as far as possible.

Next, modified embodiments, in which various modifications are applied to the first embodiment, will be explained. However, the components or parts, which are constructed in the same manner as those of the embodiment of the present teaching, are designated by the same reference numerals, any explanation of which will be appropriately omitted.

Figure 7:
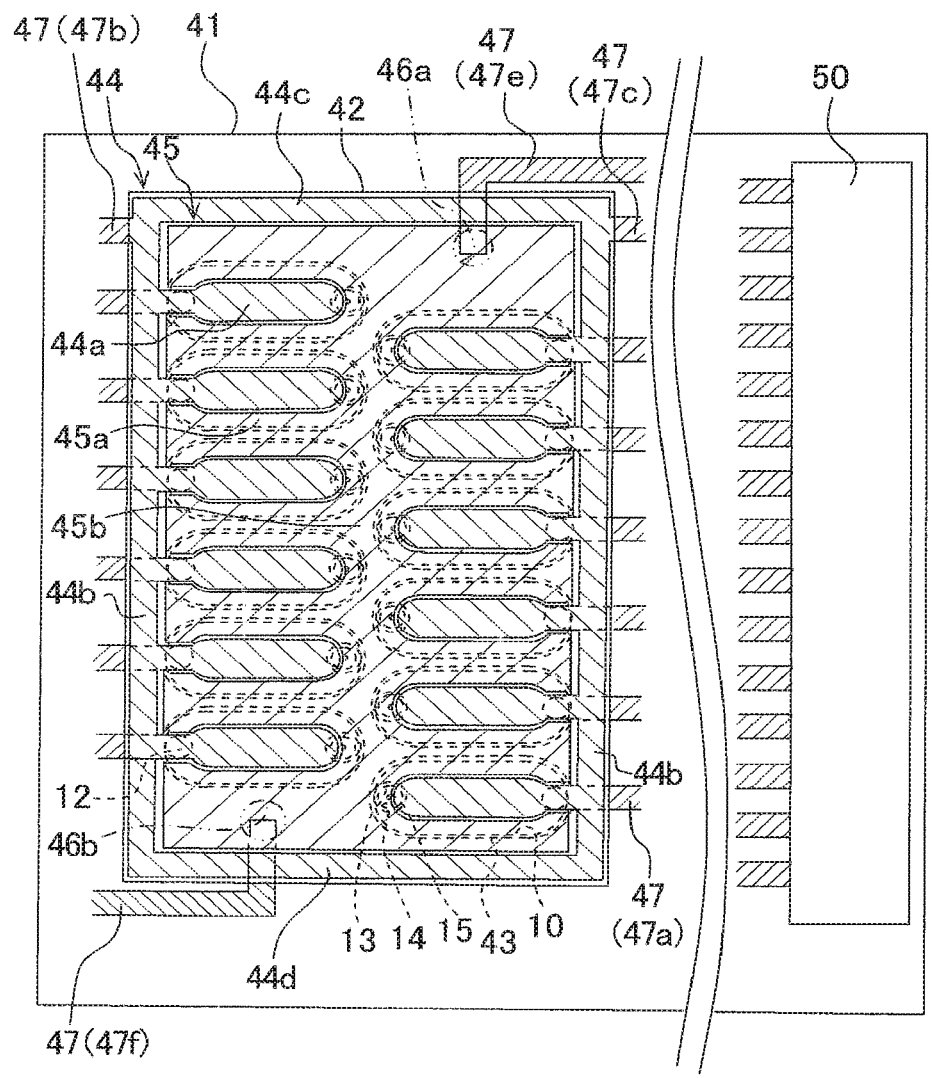
FIG. 7 shows a view according to a first modified embodiment corresponding to FIG. 4.

In a first modified embodiment, as shown in FIG. 7, the common electrode 44 further includes a joining portion 44d which connects the lower end portions of the two connecting portions 44b. Accordingly, the common electrode 45 is surrounded on the four sides by the two connecting portions 44b and the two joining portions 44c, 44d.

A wiring line 47f is provided in place of the wiring line 47d. The first end of the wiring line 47f is connected to the lower-left end portion of the common electrode 45 via the conductive material charged into the through-hole 46a formed at the lower-left end portion of the insulating layer 46 opposed to the common electrode 45. The wiring line 47f extends downwardly from the connecting portion on the upper surface of the insulating layer 46 (see FIG. 5) while striding over (stepping over) the joining portion 44d.

When the common electrode 45 is surrounded on the four sides by the two connecting portions 44b and the two joining portions 44c, 44d, the wiring lines cannot be connected to the common electrode 45 on the upper surface of the piezoelectric layer 42. Even in such a situation, the wiring lines 47e, 47f, which extend while striding over the joining portions 44c, 44d, are provided as the wiring lines which are connected to the common electrode 45. Accordingly, it is possible to connect the wiring lines to the mutually separated portions of the common electrode 45, and it is possible to uniformize the electric potential of the common electrode 45.

In this case, the lower end portions of the two connecting portions 44b are connected to one another by the joining portion 44d in addition to the fact that the upper end portions of the two connecting portions 44b are connected to one another by the joining portion 44c. Therefore, the electric potential of the common electrode 44 is further uniformized.

In the first embodiment, the portion of the wiring line 47e (second connecting wiring), which extends while striding over the joining portion 44c, is arranged on the upper surface of the insulating layer 46 which is arranged on the upper surface of the piezoelectric layer 42 so that the entire common electrodes 44, 45 are covered therewith. However, the present teaching is not limited thereto. It is not necessarily indispensable that the insulating layer is formed to cover the entire common electrode.

Figure 8:
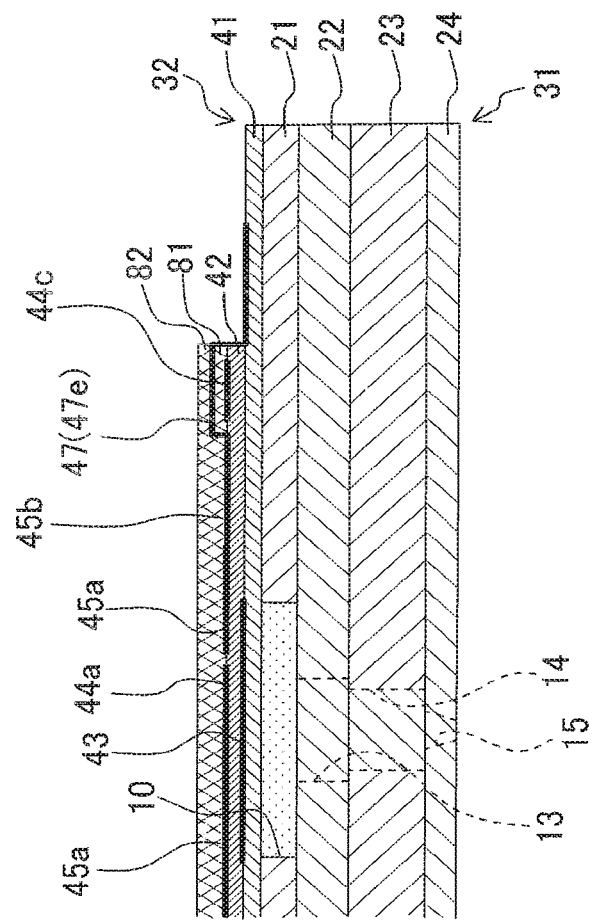
FIG. 8 shows a view according to a second modified embodiment corresponding to FIG. 6.

In a second modified embodiment, as shown in FIG. 8, an insulating layer 81 is arranged on the upper surface of the piezoelectric layer 42 so that only the joining portion 44c is covered therewith. The portion of the wiring line 47e, which extends while striding over the joining portion 44c, is arranged on the upper surface of the insulating layer 81. Further, another insulating layer 82 is arranged on the upper surface of the piezoelectric layer 42 on which the insulating layer 81 and the abovementioned portion of the wiring line 47e are arranged so that the common electrodes 44, 45 are covered therewith. The common electrode 44 and the common electrode 45 are prevented from any conduction on the upper surface of the piezoelectric layer 42 owing to the insulating layer 82.

Also in this case, it is possible to avoid any conduction between the wiring line 47e and the joining portion 44c by means of the insulating layer 81.

Figure 9:
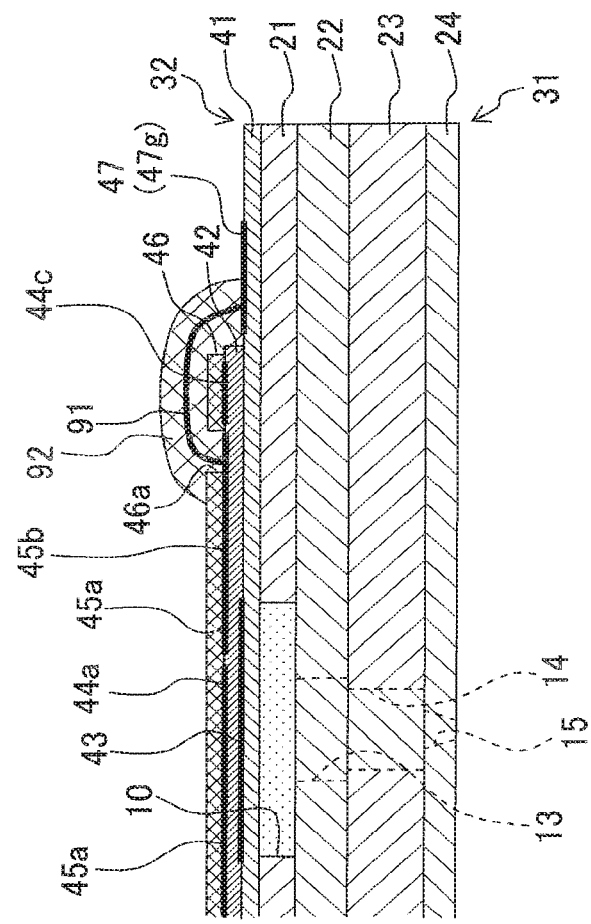
FIG. 9 shows a view according to a third modified embodiment corresponding to FIG. 6.

In a third modified embodiment, the conductive material is not charged into the through-hole 46a of the insulating layer 46. As shown in FIG. 9, a first end of a wire bonding line 91 is connected to a portion (connecting portion 45b) of the common electrode 45 exposed from the through-hole 46a, and a second end of the wire bonding line 91 is connected to a wiring line 47g arranged on the upper surface of the vibration plate 41. Accordingly, the common electrode 45 and the wiring line 47g are connected to one another by the wire bonding line 91. Further, in order to avoid any exfoliation of the wire bonding line 91, an insulating material 92, which is composed of, for example, a synthetic resin material and which is formed by the potting, is arranged to cover not only the wire bonding line 91, but also the connecting portions with respect to the common electrode 45 and the wiring line 47g. In this case, the wiring line 47g corresponds to the second wiring portion according to the present teaching, and the wire bonding line 91 corresponds to the second connecting wiring according to the present teaching.

In this arrangement, the wire bonding line 91 and the common electrode 45 are connected to one another and the wire bonding line 91 and the wiring line 47g are connected to one another, for example, by means of the ultrasonic welding. In this case, the first end and the second end of the wire bonding line 91 are pressed against the foregoing portion of the common electrode 45 and the wiring line 47g respectively (by applying the pressure) to effect the abutment. In this state, the ultrasonic wave is applied to the abutment portions. Accordingly, the portions of the wire bonding line 91 and the common electrode 45 (the portions of the wire bonding line 91 and the wiring line 47g), at which they mutually make the abutment, are converted into the alloy, and the wire bonding line 91 and the common electrode 45 (the wire bonding line 91 and the wiring line 47g) are connected to one another.

Also in this case, the portion of the common electrode 45, which is surrounded by the connecting portions 44b (see FIG. 4) and the joining portion 44c, can be connected to the wiring line 47g by means of the wire bonding line 91. Therefore, it is possible to uniformize the electric potential of the common electrode 45 in the same manner as in the first embodiment.

When the insulating material 92 is formed by means of the potting, the insulating material 92 also flows into the portion disposed on the lower side of the wire bonding line 91. Therefore, the portion of the insulating layer 46, which covers the joining portion 44c, may be omitted. Further, the wire bonding line 91 is arranged in the state of being separated from the joining portion 44c. Therefore, it is not necessarily indispensable to form the insulating material 92.

In the first embodiment and the first to third modified embodiments, the wiring lines 47e, 47f, 47g and the wire bonding line 91 are allowed to stride over the joining portions 44c, 44d. However, they may be allowed to stride over any one of the two connecting portions 44b.

In the first embodiment, the common electrode 44 (first common electrode) has the two connecting portions 44b which are provided corresponding to the individual electrodes 43 arranged in the two arrays and the joining portion 44c which connects the two connecting portions 44b, and the common electrode 45 (second common electrode) is surrounded by the two connecting portions 44b and the joining portion 44c. However, the present teaching is not limited thereto.

Figure 10:
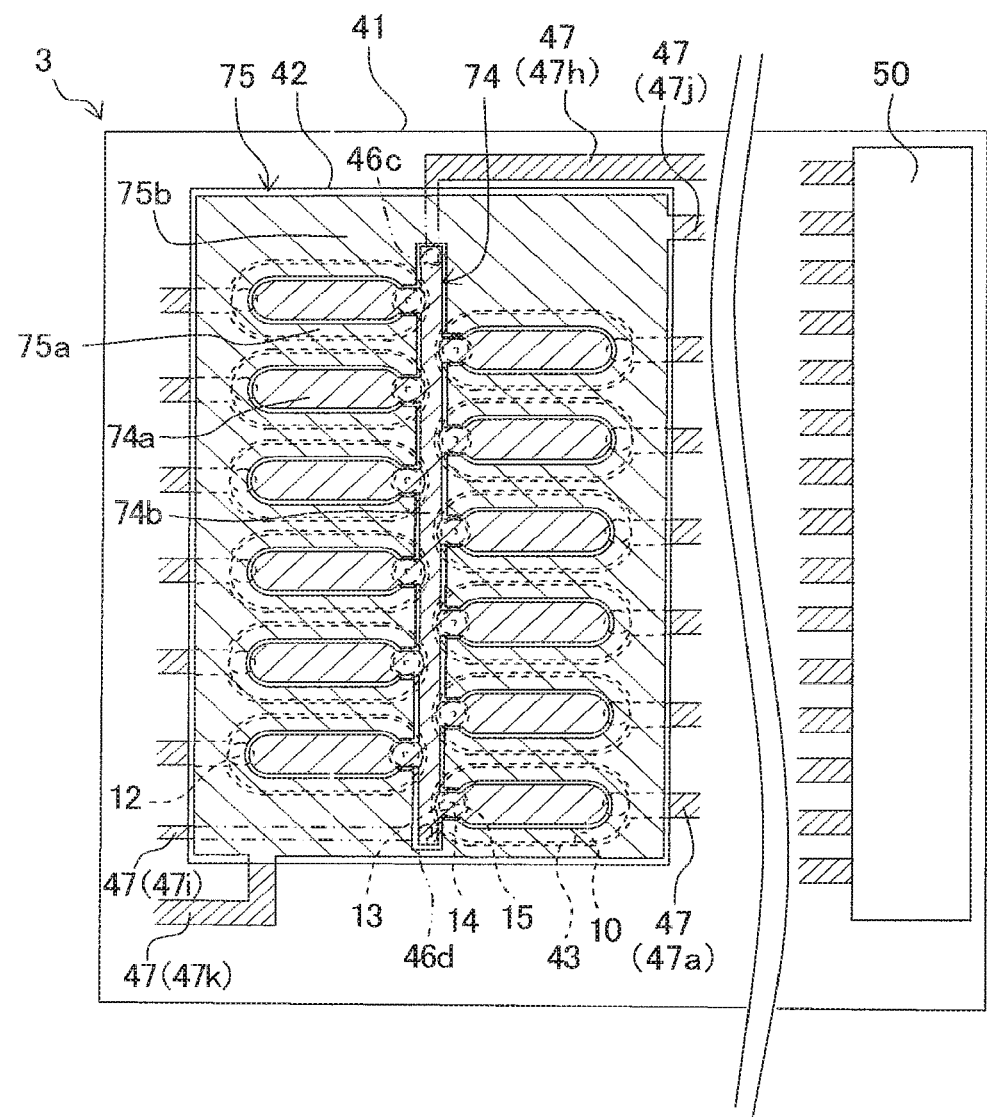
FIG. 10 shows a view according to a fourth modified embodiment corresponding to FIG. 4.

In a fourth modified embodiment, as shown in FIG. 10, common electrodes 74, 75 are arranged on the upper surface of the piezoelectric layer 42 in place of the common electrodes 44, 45. The common electrode 74 (first common electrode) has a plurality of facing portions 74a (first facing portions) which face the plurality of pressure chambers 10 respectively and a connecting portion 74b (first connecting portion) which mutually connects the plurality of facing portions 74a.

The common electrode 75 (second common electrode) is arranged to surround the common electrode 74. The common electrode 75 has a plurality of facing portions 75a (second facing portions) which face the plurality of pressure chambers 10 respectively and a connecting portion 75b (second connecting portion) which mutually connects the plurality of facing portions 75a.

Wiring lines 47h, 47i are connected to an upper end portion and a lower end portion of the connecting portion 74b of the common electrode 74 respectively. Wiring lines 47j, 47k are connected to an upper-right end portion and a lower-left end portion (connecting portions 75b) of the common electrode 75 respectively as viewed in FIG. 10.

The first ends of the wiring lines 47h, 47i are connected to the upper end portion and the lower end portion of the connecting portion 74b, respectively, via the conductive material charged into through-holes 46c, 46d which are formed at portions of the insulating layer 46 (see FIG. 5) facing the upper end portion and the lower end portion of the connecting portion 74b. The wiring line 47h extends, from the connecting portion in the upward direction as viewed in FIG. 10, on the upper surface of the insulating layer 46 to stride over the common electrode 75 (connecting portion). Further, the wiring line 47h is led out to the upper surface of the vibration plate 41 via the upper side surface of the insulating layer 46. Similarly, the wiring line 47i also extends, from the connecting portion in the leftward direction, on the upper surface of the insulating layer 46 to stride over the common electrode 75 (connecting portion). Further, the wiring line 47i is led out to the upper surface of the vibration plate 41 via the left side surface of the insulating layer 46.

As described above, the first ends of the wiring lines 47j, 47k are connected to the portions of the common electrode 75, respectively, on the upper surface of the piezoelectric layer 42. Further, the wiring lines 47j, 47k are led out to the upper surface of the vibration plate 41 via the right and lower side surfaces of the piezoelectric layer 42 as viewed in FIG. 10.

The wiring lines 47h to 47k, which are led out to the upper surface of the vibration plate 41, are laid out on the upper surface of the vibration plate 41, and the second ends of the wiring lines 47h to 47k are connected to the driver IC 50, in the same manner as described in the first embodiment.

In the fourth modified embodiment, the portions of the wiring lines 47h, 47i, which are arranged on the upper surface of the vibration plate 41, correspond to the first wiring portions according to the present teaching. The portions of the wiring lines 47h, 47i, which are arranged to stride over the common electrode 75 and which connect the first wiring portions and the upper/lower end portion of the connecting portion 74b, correspond to the first connecting wirings according to the present teaching. The portions of the wiring lines 47j, 47k, which are arranged on the upper surface of the vibration plate 41, correspond to the second wiring portions according to the present teaching. The portions of the wiring lines 47j, 47k, which are allowed to pas along the side surfaces of the piezoelectric layer 42 to connect the second wiring portions and the common electrode 45, correspond to the second connecting wirings according to the present teaching. In the fourth modified embodiment, as described above, the first connecting wirings extend while striding over the second connecting portion.

Also in this case, the wiring lines 47h to 47k are connected to the mutually separated portions of the common electrodes 74, 75. Therefore, it is possible to uniformize the electric potentials of the common electrodes 74, 75 respectively.

Second Embodiment

Next, a second embodiment of the present invention will be explained. However, in the second embodiment, only a part of the arrangement of the piezoelectric actuator is different from that of the first embodiment. Therefore, only portions, which are different from those of the first embodiment, will be explained below.

Figure 11:
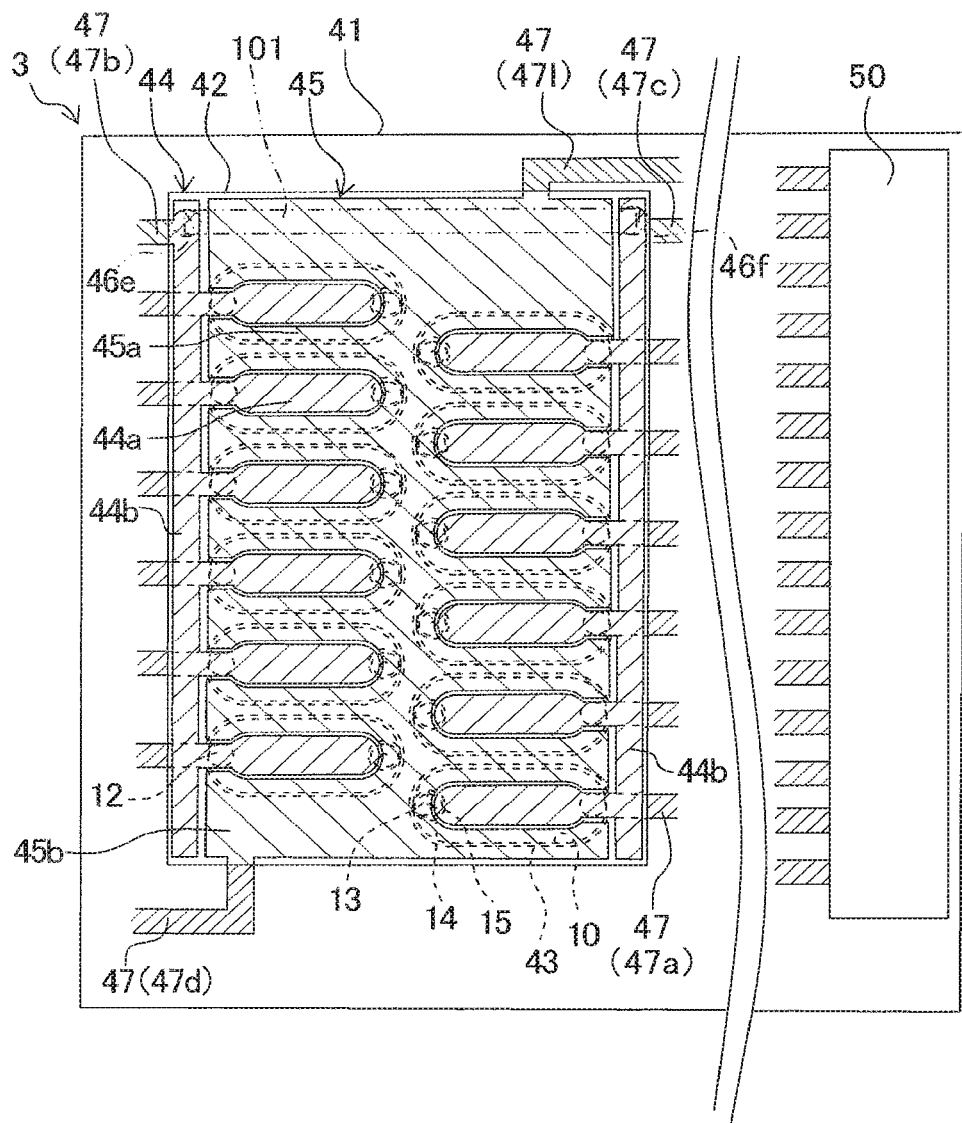
FIG. 11 shows a view according to a second embodiment corresponding to FIG. 4.

As shown in FIG. 11, in the second embodiment, the common electrode 44 does not have the connecting portion 44c (see FIG. 4) on the piezoelectric layer 42. The two connecting portions 44b are arranged while being separated from each other with the common electrode 45 intervening therebetween in the scanning direction (left-right direction as shown in FIG. 11). A wiring line 47l is connected to the common electrode 45 in place of the wiring line 47e (see FIG. 4).

As shown in FIG. 11, the first end of the wiring line 47l is connected to an upper-right end portion (connecting portion 45b) of the common electrode 45 on the upper surface of the piezoelectric layer 42. Further, the wiring line 47l is led out to the upper surface of the vibration plate 41 (surface disposed on the side opposite to the channel unit) via the upper side surface of the piezoelectric layer 42. Further, the wiring line 47l is laid out on the upper surface of the vibration plate 41, and the wiring line 47l is connected to the driver IC 50. The portion of the wiring line 47l, which is arranged on the upper surface of the vibration plate 41, corresponds to the first wiring portion according to the present teaching. The portion of the wiring line 47l, which is allowed to pass along the side surface of the piezoelectric layer 42 to connect the first wiring portion and the common electrode 45, corresponds to the first connecting wiring according to the present teaching.

A bypass wiring 101 is arranged on the upper surface of the insulating layer 46 (see FIG. 5). The bypass wiring 101 extends in the scanning direction while striding over the common electrode 45. The both ends thereof are connected to upper end portions of the two connecting portions 44b respectively via the conductive material charged into through-holes 46e, 46f formed at portions of the insulating layer 46 facing the upper end portions of the two connecting portions 44b. Accordingly, the two connecting portions 44b are connected to one another by the bypass wiring 101.

Also in this case, the wiring lines 47d, 47l (second connecting wiring) are connected respectively to the mutually separated lower-left and upper-right end portions (a plurality of portions) of the common electrode 45 on the upper surface of the piezoelectric layer 42, in the same manner as in the first embodiment. Therefore, it is possible to improve the uniformity of the electric potential of the common electrode 45.

Further, the two connecting portions 44b, which are arranged while being separated from each other with the common electrode 45 intervening therebetween in the scanning direction, are connected to one another by the bypass wiring 101 which extends while striding over the common electrode 45. Therefore, the electric potential of the common electrode 44 is uniformized.

Next, a modified embodiment, in which various modifications are applied to the second embodiment, will be explained. However, the components or parts, which are constructed in the same manner as those of the second embodiment, are designated by the same reference numerals, any explanation of which will be appropriately omitted.

In the second embodiment, the two connecting portions 44b, which are arranged and separated from each other, are connected to one another by the bypass wiring 101. However, the present teaching is not limited thereto.

Figure 12:
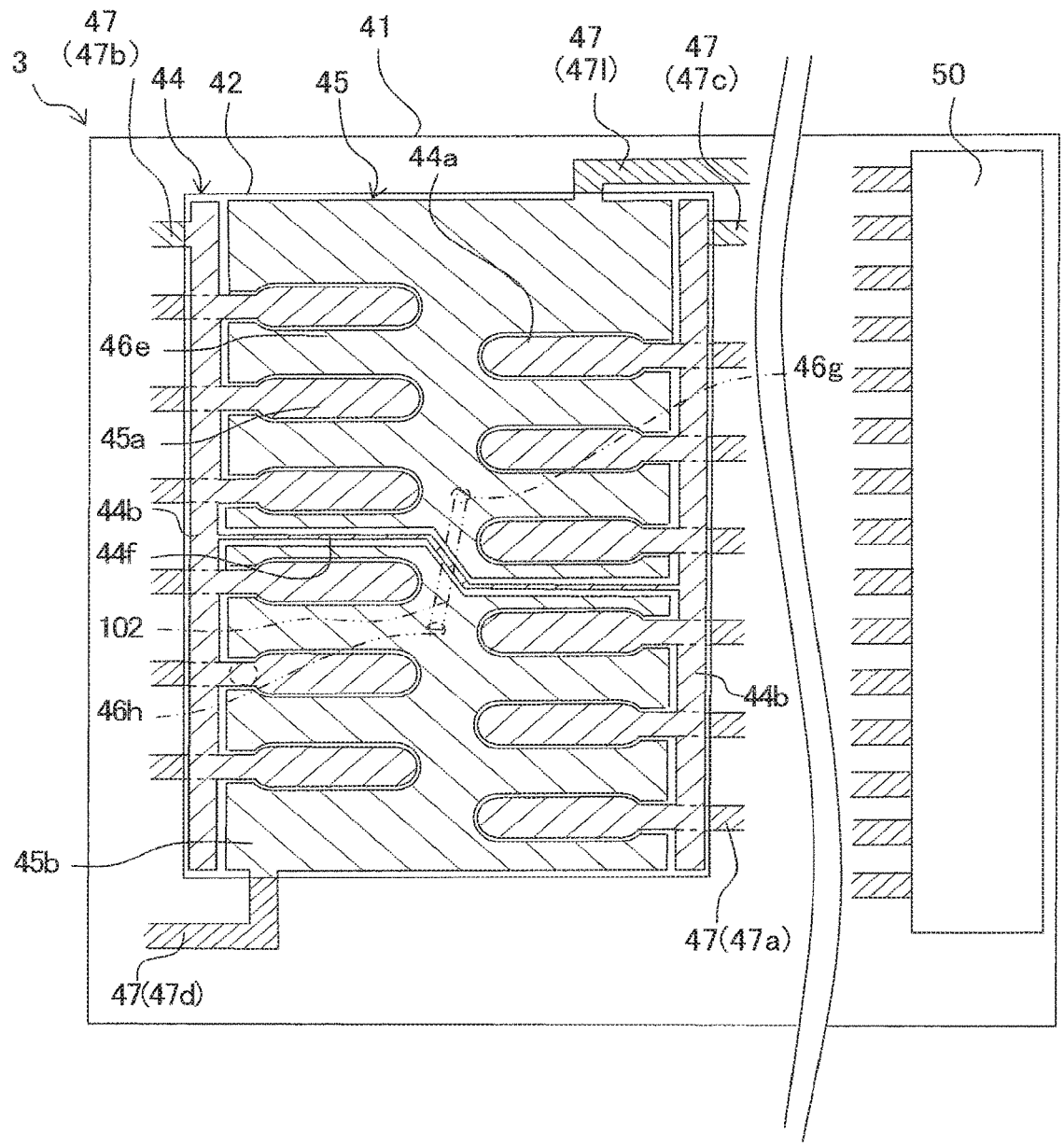
FIG. 12 shows a view according to a fifth modified embodiment corresponding to FIG. 4.

In a fifth modified embodiment, as shown in FIG. 12, the common electrode 44 further includes a joining portion 44f which connects substantially central portions of the two connecting portions 44 to one another. Therefore, the connecting portion 45b of the common electrode 45 is divided into two portions which are separated from each other while interposing the joining portion 44f in relation to the up-down direction as viewed in FIG. 12.

In this arrangement, conversely to the second embodiment, the common electrode 45 corresponds to the first common electrode according to the present teaching, and the common electrode 44 corresponds to the second common electrode according to the present teaching. The respective portions of the connecting portion 45b, which are divided into two, correspond to the first connecting portions according to the present teaching respectively. That is, the common electrode 45 has the two first connecting portions.

In the fifth modified embodiment, the portion corresponding to the first wiring portion and the portion corresponding to the second wiring portion are reversed to one another, and the portion corresponding to the first connecting wiring and the portion corresponding to the second connecting wiring are reversed to one another, as compared with the second embodiment.

Further, a bypass wiring 102 is arranged on the upper surface of the insulating layer 46 (see FIG. 5). The bypass wiring 102 extends in a direction slightly inclined with respect to the paper feeding direction (left-right direction as viewed in FIG. 12) while striding over the joining portion 44f. The both ends of the bypass wiring 102 are connected respectively to the abovementioned two portions of the connecting portion 45b via the conductive material charged into two through-holes 46g, 46h formed respectively at portions of the insulating layer 46 facing the two portions of the common electrode 45. Accordingly, the two portions of the connecting portion 45b are connected to one another by the bypass wiring 102.

Also in this case, it is possible to uniformize the electric potentials of the common electrodes 44, 45 respectively at all portions.

Also in the second embodiment, the two connecting portions 44b may be connected to one another by means of a wire bonding provided in the same manner as in the third modified embodiment described above, in place of the bypass wiring 101 arranged on the upper surface of the insulating layer 46.

In the second embodiment, the bypass wiring 101 mutually connects the upper end portions of the two connecting portions 44b. However, the bypass wiring 101 may connect other portions of the two connecting portions 44b. Further, a plurality of bypass wirings may be provided.

In the second embodiment, the common electrode 44 (first common electrode) is provided with the two connecting portions 44b (first connecting portions) corresponding to the arrays of the individual electrodes 43. However, the present teaching is not limited thereto. It is not necessarily indispensable that the first connecting portion should be provided corresponding to the array of the individual electrode 43, provided that the first connecting portion connects at least two first facing portions to one another. The number of the first connecting portions is not limited to two as well. The first common electrode may have three or more first connecting portions. When the three or more first connecting portions are provided, for example, a plurality of bypass wirings are provided to connect every mutually different two of the three or more first connecting portions. In this way, it is possible to allow all of the first connecting portions to be in conduction.

In the first and second embodiments described above, the plurality of individual electrodes 43 are arranged on the lower surface of the piezoelectric layer 42, and the common electrodes 44, 45 are arranged on the upper surface of the piezoelectric layer 42. However, conversely to the above, the common electrodes 44, 45 may be arranged on the lower surface of the piezoelectric layer 42, and the plurality of individual electrodes 43 may be arranged on the upper surface of the piezoelectric layer 42.

In this case, for example, an insulating layer is arranged between the piezoelectric layer 42 and the vibration plate 41. The portions of the wiring lines 47e, 47f, 47h, 47i which extend while striding over the joining portions 44c, 44d and the common electrode 75 (first and second connecting wirings) and the bypass wiring 101 are arranged on the lower surface of the insulating layer.

In the first and second embodiments, the common electrode 44 (facing portion 44a) faces the substantially central portion of the pressure chamber 10, and the common electrode 45 (facing portion 45a) is opposed to the portion other than the substantially central portion of the pressure chamber 10. However, there is no limitation thereto. For example, conversely to the above, the facing portions of the first and second common electrodes may face portions of the pressure chamber 10 different from those in the first embodiment. That is, the second facing portion may face the substantially central portion of the pressure chamber 10 and the first facing portion may face the portion other than the substantially central portion of the pressure chamber 10. In this case, for example, the positions and the shapes of the connecting portions of the respective common electrodes may be appropriately changed in conformity with, for example, the positions and the shapes of the facing portions of the first and second common electrodes.

In the foregoing embodiments, the piezoelectric actuator is arranged with only any one of the wiring line which is connected to one of the two types of the common electrodes while striding over the other common electrode and which is exemplified by the wiring lines 47e, 47f, 47h, 47i and the wire bonding line 91. Alternatively, the piezoelectric actuator is arranged with the bypass wiring which mutually connects the two or more connecting portions of one of the two types of the common electrodes while striding over the other common electrode and which is exemplified by the bypass wirings 101, 102. However, the piezoelectric actuator may be arranged with both of the two types of the wiring lines depending on the arrangement of the two types of the common electrodes.

In the foregoing embodiments, the wiring lines 47e, 47f, 47h, 47i are arranged on the insulating layer, or the insulating material is arranged around the wire bonding line 91 by means of the potting. However, there is no limitation thereto. The wiring lines 47, the wire bonding line 91, and the bypass wiring lines 101, 102 may be formed with coated electric wires or electric cables.

The foregoing embodiments are illustrative of the exemplary case in which the present teaching is applied to the piezoelectric actuator to be used for the ink-jet head of the so-called serial type printer for discharging the inks from the nozzles while being reciprocatively moved in the scanning direction together with the carriage. However, there is no limitation thereto. It is also allowable to apply the present teaching to a piezoelectric actuator to be used for a so-called line head which is fixed to the printer and which extends over the entire length in the widthwise direction of the recording paper. Further, it is also possible to apply the present teaching to a piezoelectric actuator to be used for any apparatus or device other than the ink-jet head. The piezoelectric actuator according to the present teaching is also preferably applicable to any liquid discharge head to be carried on a liquid discharge apparatus usable, for example, for an apparatus for producing a color filter of a liquid display apparatus by discharging any liquid other than the ink including, for example, a coloring liquid and an apparatus for forming electrical wiring lines by discharging a conductive liquid.

What is claimed is:

1. An ink-jet head comprising:
   a channel body defining at least:
      a first pressure chamber; and
      a second pressure chamber;
   an insulating layer arranged over the channel body in a height direction, wherein portions of the insulating layer are arranged over the first pressure chamber and the second pressure chamber;
   a piezoelectric layer arranged over the insulating layer in the height direction, wherein portions of the piezoelectric layer are arranged over the first pressure chamber and the second pressure chamber;
   a conductor comprising:
      a first portion arranged over the piezoelectric layer in the height direction, wherein the first portion is arranged over the first pressure chamber in the height direction;
      a second portion arranged over the piezoelectric layer in the height direction, wherein the second portion is arranged over the second pressure chamber in the height direction;
      a third portion arranged on a surface extending away from the insulating layer in the height direction;
      a fourth portion arranged on a surface extending away from the insulating layer in the height direction; and,
      a fifth portion arranged over the piezoelectric layer in the height direction, wherein the fifth portion is connected with the first portion, the second portion, the third portion and the fourth portion;
   a first individual electrode arranged between the insulating layer and the piezoelectric layer, wherein the first individual electrode is arranged over the first pressure chamber; and
   a second individual electrode arranged between the insulating layer and the piezoelectric layer, wherein the second individual electrode is arranged over the first pressure chamber.

2. The ink-jet head according to claim 1,
   wherein the first pressure chamber and the second pressure chamber are arranged side by side in a first direction, the first direction is orthogonal to the height direction.

3. The ink-jet head according to claim 2, further comprising:
   a first individual conductor extending away from the first individual electrode in a second direction, the second direction being orthogonal to the height direction and the first direction; and
   a second individual conductor extending away from the second individual electrode in the second direction.

4. The ink-jet head according to claim 3,
   wherein the first individual conductor has a portion located between the insulating layer and the piezoelectric layer, and
   wherein the second individual conductor has a portion located between the insulating layer and the piezoelectric layer.

5. The ink-jet head according to claim 4,
   wherein a width of the portion of the first individual conductor in the first direction is smaller than a width of the first individual electrode in the first direction, and
   wherein a width of the portion of the second individual conductor in the first direction is smaller than a width of the second individual electrode in the first direction.

6. The ink-jet head according to claim 5,
   wherein the portion of the first individual conductor overlaps with the conductor in the height direction.

7. The ink-jet head according to claim 6,
   wherein the portion of the first individual conductor overlaps with the fifth portion of the conductor in the height direction.

8. The ink-jet head according to claim 7,
   wherein the fifth portion has a portion overlapped with other portion of the channel unit in the height direction, the other portion is different from the first pressure chamber and the second pressure chamber, and
   wherein the portion of the first individual conductor overlaps with the portion of the fifth portion of the conductor in the height direction.

9. The ink-jet head according to claim 3,
   wherein the fifth portion has a portion extending from the third portion towards the fourth portion along the first direction.

10. The ink-jet head according to claim 9,
    wherein the first individual conductor and the second individual conductor are arranged between the third portion and the fourth portion in the first direction.

11. The ink-jet head according to claim 9,
    wherein the portion of the fifth portion overlaps with other portion of the channel unit in the height direction, the other portion is different from the first pressure chamber and the second pressure chamber.

12. The ink-jet head according to claim 2,
    wherein the fifth portion has a portion extending from the third portion towards the fourth portion along the first direction.

13. The ink-jet head according to claim 12,
    wherein the first pressure chamber and the second pressure chamber are arranged between the third portion and the fourth portion in the first direction.

14. The ink-jet head according to claim 12,
    wherein the portion of the fifth portion overlaps with other portion of the channel unit in the height direction, the other portion is different from the first pressure chamber and the second pressure chamber.

15. The ink-jet head according to claim 2,
    wherein the channel body further defining:
    a third pressure chamber; and
    a fourth pressure chamber,
    wherein the third pressure chamber and the fourth pressure chamber are arranged side by side in the first direction, and
    wherein the first pressure chamber and the second pressure chamber are offset with the third pressure chamber and the fourth pressure chamber in a second direction, the second direction is orthogonal to the height direction and the first direction.

16. The ink-jet head according to claim 15,
    wherein the first pressure chamber is elongated in the second direction.

17. The ink-jet head according to claim 1,
    wherein the insulating layer includes zirconia.

18. The ink-jet head according to claim 1,
    wherein the insulating layer includes ceramic material.

* * * * *